United States Patent [19]

Westwick

[11] Patent Number: 4,737,732
[45] Date of Patent: Apr. 12, 1988

[54] LOW VOLTAGE OPERATIONAL AMPLIFIER HAVING A SUBSTANTIALLY FULL RANGE OUTPUT VOLTAGE

[75] Inventor: Alan L. Westwick, Austin, Tex.

[73] Assignee: Motorola, Inc., Schaumburg, Ill.

[21] Appl. No.: 18,310

[22] Filed: Feb. 24, 1987

[51] Int. Cl.[4] .................................. H03F 3/45
[52] U.S. Cl. ................................. 330/261; 330/255
[58] Field of Search ............... 330/252, 253, 255, 257, 330/261

[56] References Cited
U.S. PATENT DOCUMENTS 3,895,307  7/1975  Furuhashi .................... 330/261

Primary Examiner—Gene Wan
Attorney, Agent, or Firm—John A. Fisher; Jeffrey Van Myers; Robert L. King

[57] ABSTRACT

A power amplifier particularly useful as a line driver operating at low power supply voltages is provided. An input portion comprising a differential input configuration is coupled to an output stage having a P-channel MOS transistor connected in series with an N-channel MOS transistor between two power supply voltage terminals. A control portion is coupled to both the input portion and the output stage for providing first and second control signals to the output portion. The control portion regulates the output quiescent current at a predetermined value independent of signal amplification provided by the input portion. The output signal can swing substantially between two power supply voltage potentials.

9 Claims, 2 Drawing Sheets

LOW VOLTAGE OPERATIONAL AMPLIFIER HAVING A SUBSTANTIALLY FULL RANGE OUTPUT VOLTAGE

TECHNICAL FIELD

This invention relates generally to amplifier circuits, and more particularly, to differential line driver power amplifiers.

BACKGROUND ART

Amplifiers have typically used an output drive stage formed by two series connected transistors of opposite conductivity. Bipolar amplifiers often use an output stage having an NPN transistor with a collector connected to a positive power supply connected in series with a PNP transistor having a collector connected to a negative power supply. Positive and negative fifteen volt power supplies are commonly used in connection with bipolar amplifiers. The output voltage is not able to vary a full fifteen volts as the voltage drop across each transistor of the output stage, $V_{BE}$, is approximately 0.6 volt and prevents a full range output voltage swing. When a large power supply voltage is used, lack of a full range of output voltage is typically not a problem. However, if the power supply voltage range is much smaller, such as five volts, the lack of full output voltage range may be very limiting in some applications.

In MOS circuits, one of the most common power supply voltage specifications is plus/minus five volts. The ability to provide an output voltage which can vary substantially over the entire power supply voltage range remains important. However, since the voltage range is ten volts, the output does not typically need to be able to vary the full ten volts. As MOS circuits advance, more circuits are being designed for a single low voltage power supply voltage such as five volts. Therefore, the maximum output voltage attainable is five volts or less. The output voltage range problem is aggravated further in MOS circuits because MOS field effect transistors typically have a gate to source voltage drop, $V_{GS}$, of one volt or more. Thus when an N-channel MOS transistor is connected in series with a P-channel MOS transistor between five volts and a ground potential, the maximum output voltage variation may be no greater than three volts. In high current drive applications, the low transconductance of an MOS transistor further increases the $V_{GS}$ of the MOS transistor which only further reduces the output voltage swing. An output stage which uses a P-channel MOS transistor connected to a positive power supply in series with an N-channel MOS transistor connected to the negative power supply provides improved output voltage swing as opposed to having the N-channel MOS transistor connected to the positive power supply. However, the quiescent current thru the output stage is difficult to control resulting in varying power dissipation, and stability problems may exist when this structure is used with a differential amplifier stage.

BRIEF DESCRIPTION OF THE INVENTION

Accordingly, an object of the present invention is to provide an improved low voltage output driver having an output voltage range substantially equal to the range of the power supply voltages.

Another object of the present invention is to provide an improved low voltage output driver for driving a low impedance load and having a predetermined quiescent current.

In carrying out the above and other objects of the present invention, there is provided, in one form, a low voltage line driver circuit having a substantially full range output voltage relative to a power supply voltage range. An output stage provides the output voltage and comprises a first transistor of a first conductivity type coupled between a power supply terminal and an output terminal. A second transistor of a second conductivity type is coupled between the output terminal and a reference voltage. The output stage conducts a quiescent current of a predetermined value when no output load is connected to the output terminal. An input portion is coupled to the output stage for providing first and second control signals to the first and second transistors, respectively, to provide the output voltage in response to a differential between the first and second input voltages. A quiescent current control portion is coupled to both the input portion and the output stage. The control portion receives first and second mirror currents from the first and second transistors and mirrors first and second compensation currents to the input portion to adjust the output quiescent current in response to deviation from the predetermined value.

These and other objects, features and advantages will be more clearly understood from the following detailed description taken in conjunction with the accompanying drawings.

DETAILED DESCRIPTION OF THE INVENTION

Figure 1:
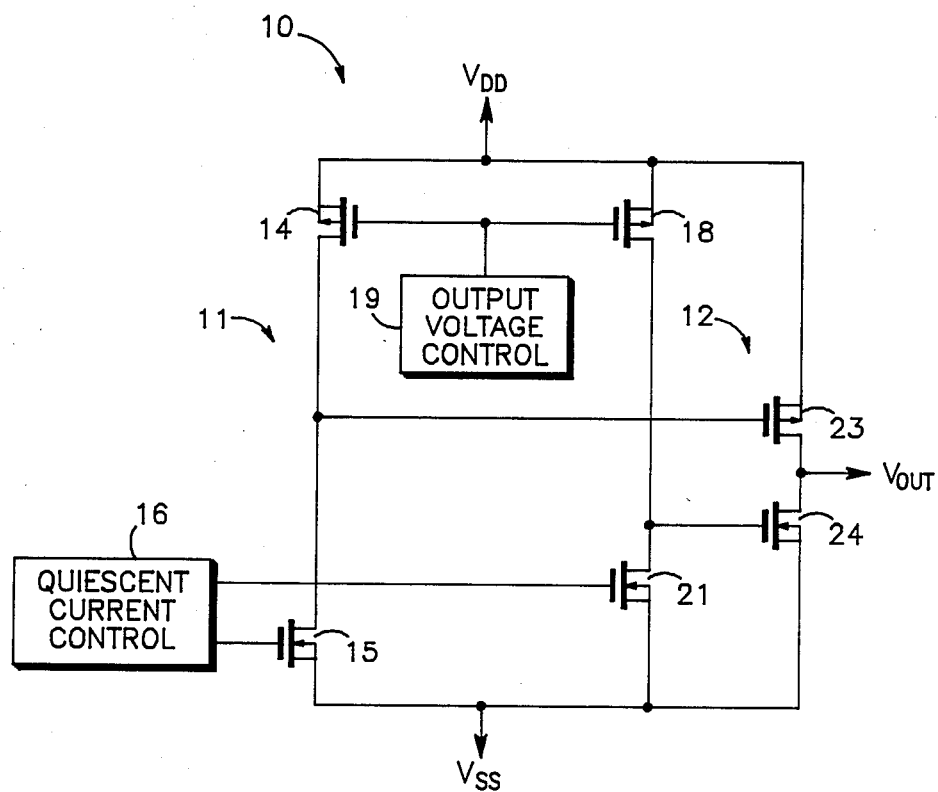
FIG. 1 illustrates in partial schematic form, a CMOS power amplifier in accordance with the present invention.

Shown in FIG. 1 is a circuit 10 generally comprising an amplifier and control portion 11 and an output portion 12. Circuit 10 is illustrated with two power supply voltages $V_{DD}$ and $V_{SS}$ wherein $V_{DD}$ is a more positive potential. It should be apparent that a single power supply may used wherein voltage potential $V_{SS}$ is a ground potential. Circuit 10 provides an output voltage $V_{OUT}$ capable of varying substantially between $V_{DD}$ and $V_{SS}$ and which has a predetermined output quiescent current.

Amplifier and control portion 11 comprises a P-channel transistor 14 having a source connected to supply voltage $V_{DD}$, a gate, and a drain. An N-channel transistor 15 has a drain connected to the drain of transistor 14, a gate connected to a first output of a quiescent current control circuit 16, and a source connected to supply voltage $V_{SS}$. A P-channel transistor 18 has a source connected to supply voltage $V_{DD}$. A gate of transistor 18 is connected to both the gate of transistor 14 and to an output of an output voltage control circuit 19. A drain of transistor 18 is connected to a drain of an N-channel transistor 21. A gate of transistor 21 is connected to a second output of quiescent current control circuit 16. A source of transistor 21 is connected to power supply voltage $V_{SS}$.

Output portion 12 comprises a P-channel transistor 23 having a source connected to supply voltage $V_{DD}$, a gate connected to the drain of transistor 14, and a drain for providing the output voltage. An N-channel transistor 24 has a drain connected to the drain of transistor 23, a gate connected to the drain of transistor 18, and a source connected to power supply $V_{SS}$. The substrate material of each of transistors 15, 21 and 24 is connected to supply voltage $V_{SS}$ which is the same potential as the source, and the substrate material of each of transistors 14, 18 and 23 is connected to supply voltage $V_{DD}$ which is the same potential as the source.

In operation, circuit 10 provides an output voltage which is capable of transitioning from within a few one hundred millivolts of both $V_{DD}$ and $V_{SS}$, even when driving low impedance loads. Output voltage control circuit 19 functions to receive an input signal and provide the output voltage in response to the input signal value. Output voltage control circuit 19 directly controls the biasing of transistors 14 and 18 which in turn controls the biasing of output transistors 23 and 24. Simultaneously but independently, quiescent current control circuit 16 functions to regulate the quiescent current in output transistors 23 and 24 at a predetermined quiescent current. By affecting the biasing of transistors 15 and 21, the amount of current conducted by each of transistors 23 and 24 can be closely regulated. However, the control of quiescent current control circuit 16 is independent of output voltage control circuit 19. A detailed explanation of the principles of the present invention may be more readily understood in conjunction with the detailed schematic embodiment discussed below.

Figure 2:
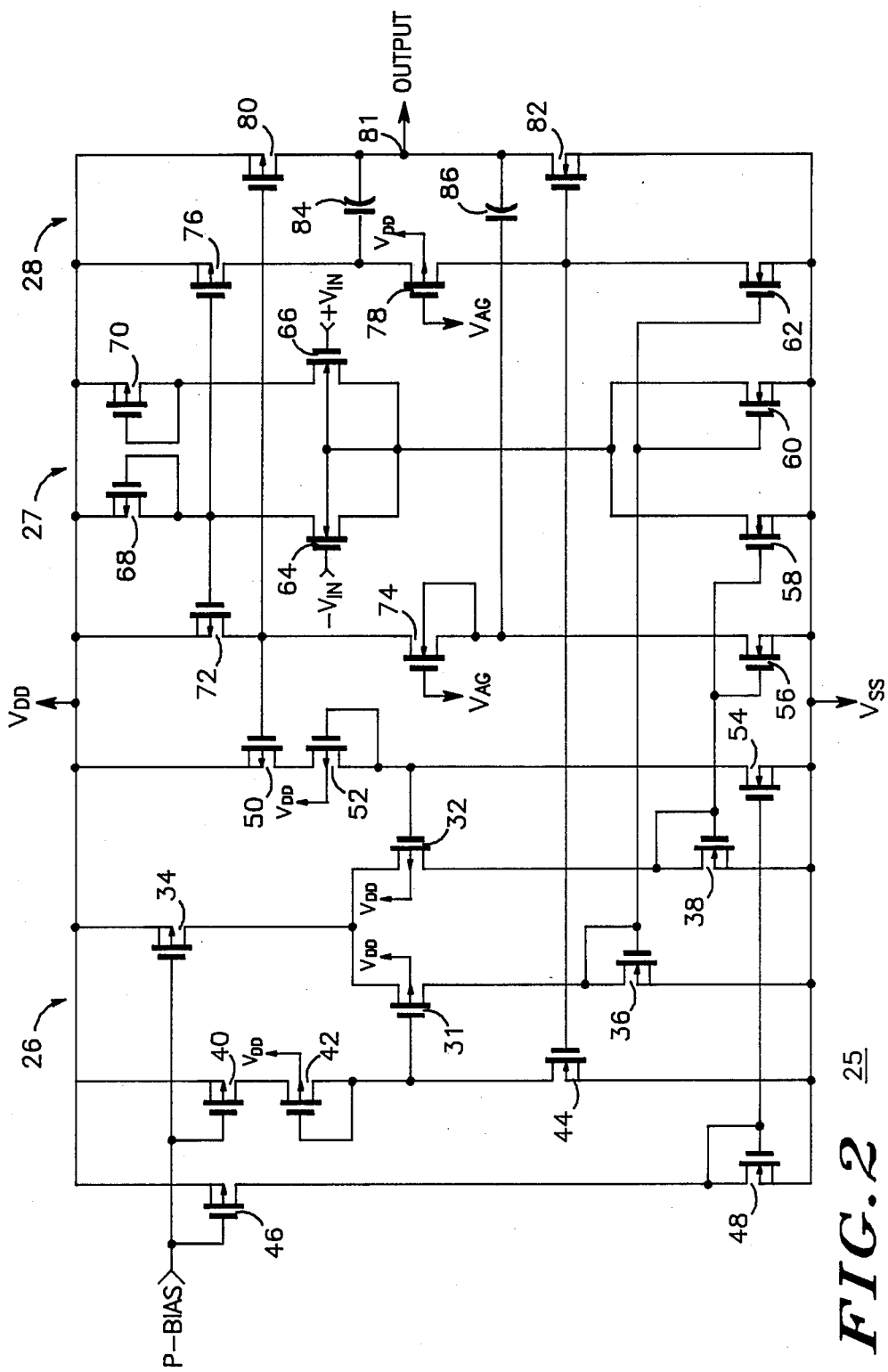
FIG. 2 illustrates in schematic form, a CMOS power amplifier in accordance with the present invention.

Shown in FIG. 2 is a power amplifier circuit 25 which implements the block diagram features of circuit 10. Circuit 25 generally comprises a quiescent current control portion 26, an input signal portion 27 and an output portion 28. Quiescent current control portion 26 comprises a differential pair of P-channel transistors 31 and 32. Each of transistors 31 and 32 has a source connected together to a drain of a P-channel transistor 34. A gate of transistor 34 is connected to a bias voltage labeled "P-Bias", and a source of transistor 34 is connected to a positive power supply voltage $V_{DD}$. A drain of transistor 31 is connected to both a drain and a gate of an N-channel transistor 36. A source of transistor 36 is connected to power supply voltage $V_{SS}$. A drain of transistor 32 is connected to both a drain and a gate of an N-channel transistor 38. A source of transistor 38 is connected to power supply voltage $V_{SS}$. A P-channel transistor 40 has a source connected to power supply voltage $V_{DD}$, a gate connected to the P-bias voltage, and a drain connected to a source of a P-channel transistor 42. A gate and a drain of transistor 42 are connected together and to both the gate of transistor 31 and to a drain of an N-channel transistor 44. A source of transistor 44 is connected to supply voltage $V_{SS}$. A P-channel transistor 46 has a source connected to supply voltage $V_{DD}$, a gate connected to the P-bias voltage, and a drain connected to both a drain and a gate of an N-channel transistor 48. A source of transistor 48 is connected to supply voltage $V_{SS}$. A P-channel transistor 50 has a source connected to supply voltage $V_{DD}$, a gate, and a drain connected to a source of a P-channel transistor 52. A gate of transistor 52 is connected to a drain thereof and to both the gate of transistor 32 and a drain of an N-channel transistor 54. A gate of transistor 54 is connected to a gate of transistor 48. A source of transistor 54 is connected to power supply voltage $V_{SS}$. The connected gate and drain of transistor 38 are connected to a gate of each of N-channel transistors 56 and 58. A source of each of transistors 56 and 58 is connected to supply voltage $V_{SS}$. The connected gate and drain of transistor 36 are connected to a gate of each of N-channel transistors 60 and 62. A source of each of transistors 60 and 62 is connected to supply voltage $V_{SS}$.

Input signal portion 27 comprises a differential pair of N-channel transistors 64 and 66 for receiving a negative and a positive input voltage $\pm V_{IN}$, respectively. Each of transistors 64 and 66 has a substrate connected together and has a source connected together. The substrates and sources of transistors 64 and 66 are connected together and are connected to both drains of transistors 58 and 60. A P-channel transistor 68 has a source connected to power supply voltage $V_{DD}$, and a gate and drain connected together. A P-channel transistor 70 also has a source connected to power supply voltage $V_{DD}$, and a gate and drain connected together. The gate and drain of transistor 68 are connected to both the drain of transistor 64 and to a gate of a P-channel transistor 72. A source of transistor 72 is connected to supply voltage $V_{DD}$, and a drain of transistor 72 is connected to both the gate of transistor 50 and a drain of an N-channel transistor 74. A gate of transistor 74 is connected to a reference voltage terminal labeled $V_{AG}$ which is substantially one-half between $V_{DD}$ and $V_{SS}$. A source of transistor 74 is connected to the substrate material of transistor 74 and to the drain of transistor 56. A P-channel transistor 76 has a source connected to supply voltage $V_{DD}$, a gate connected to the gate of transistor 72 and a drain connected to a source of a P-channel transistor 78. A gate of transistor 78 is connected to the reference voltage terminal labeled $V_{AG}$, and a drain of transistor 78 is connected to both the gate of transistor 44 and the drain of transistor 62.

Output portion 28 comprises a P-channel transistor 80 having a source connected to power supply voltage $V_{DD}$, a gate connected to both the drain of transistor 72 and the gate of transistor 50, and a drain connected to an output terminal 81. An N-channel transistor 82 has a drain connected to output terminal 81, a gate connected to both the drain of transistor 78 and the gate of transistor 44, and a source connected to supply voltage $V_{SS}$. A first electrode of a capacitor 84 is connected to the drain of transistor 76, and a second electrode of capacitor 84 is connected to output terminal 81. A first electrode of a capacitor 86 is connected to the source of transistor 74 and a second electrode of capacitor 86 is connected to output terminal 81. In a preferred form, all illustrated P-channel transistors have a substrate thereof connected to power supply voltage $V_{DD}$ and all N-channel transistors except transistors 64, 66 and 74 have a substrate thereof connected to power supply $V_{SS}$. While specific N-channel and P-channel MOS devices are shown, it should be clear that circuit 25 may be implemented by completely reversing the processing techniques (e.g. P-channel to N-channel) or by using other types of transistors.

In operation, input transistors 64 and 66 function to receive negative and positive input voltages, respectively, and provide an output voltage at output terminal 81 which is proportional to the differential of the input voltages. Transistors 58 and 60 function jointly as a current source to the input transistors 64 and 66 and supply a predetermined current. For purposes of illustration only, assume that transistors 58 and 60 source a combined current of 20 microamps wherein the proportion of current supplied by either transistor may vary depending on the biasing of transistors 58 and 60. Transistors 68 and 70 function as a load to transistors 64 and 66, respectively. Transistor 70, which is not in the signal path, is included in input signal portion 27 in order to provide a balanced structure to input transistors 64 and 66. Transistors 72, 74 and 56 function as a first intermediate stage, and transistors 76, 78 and 62 function as a second intermediate stage in parallel with the first intermediate stage. The first outer stage provides a first control signal to the gate of transistor 80 for biasing transistor 80. Similarly, the second outer stage provides a second control signal to the gate of transistor 82 for biasing transistor 82.

In the illustrated form, transistors 74 and 78 function as conventional cascode transistors and provide virtual ground nodes for frequency compensation capacitors 84 and 86. Cascode transistors 74 and 78 eliminate power supply rejection (PSR) degradation resulting from high frequency gate-to-drain coupling of transistors 80 and 82. Since the gate of transistor 80 tends to remain above reference voltage $V_{AG}$ and the gate of transistor 82 tends to remain below $V_{AG}$, cascode transistors 74 and 78 are of opposite conductivity type.

Transistors 72 and 76 have equal gate-to-source voltages, $V_{GS}$, and consequently will bias the gates of transistors 80 and 82 in the same direction to determine the output voltage. Current source transistors 56 and 62 however bias the gates of transistors 80 and 82 in opposite directions and function to set the output quiescent current in transistors 80 and 82 as explained below. If the input voltage differential decreases so that transistor 64 is made to be more conductive than transistor 66, transistors 72 and 76 become more conductive. The voltages at the gates of transistors 80 and 82 increase thereby decreasing the output voltage proportionately. If the voltage differential increases so that transistor 64 is made less conductive than transistor 66, transistors 72 and 76 become less conductive. The voltages at the gates of transistors 80 and 82 decrease thereby increasing the output voltage proportionately.

In quiescent current control portion 26, transistor 50 is size ratioed with output transistor 80 to conduct a predetermined fraction of current which transistor 80 conducts. For purposes of illustration only, assume that transistor 50 conducts one-tenth the current of transistor 80. Transistor 54 is a constant current sink transistor which is sized to conduct a predetermined amount of current. Transistor 54 is biased by a bias voltage derived from transistors 46 and 48. Assume for the purpose of illustration only that transistor 54 constantly conducts 10 microamps. The drain of transistor 50 often has a voltage potential near $V_{DD}$. Therefore, transistor 52 is coupled between the drain of transistor 50 and the gate of transistor 32 to level shift the gate voltage of transistor 32 so that the gate voltage of transistor 32 remains well below $V_{DD}$. In the illustrated form with the assumed transistor ratio between transistors 50 and 80, the gate of transistor 32 will rise in voltage potential if the quiescent current conducted by transistor 80 increases above ten times ten microamps, i.e. ten times the amount of current sunk by transistor 54. Therefore, the output quiescent current has been set at one hundred microamps by the ratioing of transistors 50 and 80 and the constant current sink 54. It should be noted that the value of output quiescent current is totally independent of supply voltage $V_{DD}$. Similarly, transistor 44 is size ratioed with output transistor 82 to be a predetermined fraction of the size of transistor 82. For purposes of illustration only, assume that transistor 44 is sized one-tenth the size of transistor 82 so that transistor 44 conducts one-tenth the current of transistor 82. Transistor 40 is a constant current source which is sized to provide a predetermined amount of current. In the illustrated form, transistor 40 is size ratioed to provide ten microamps. Transistor 42 functions as a level shifter the same way transistor 52 functions to level shift. The level shifting provided by transistors 42 and 52 serves to limit the input common-mode voltage range seen by the differential pair composed of transistors 31 and 32. While differential transistors 31 and 32 sense voltage variations at the drains of level shift transistors 42 and 52, current source transistor 34 provides a predetermined constant current which is divided by transistors 31 and 32. For purposes of illustration only, assume that current source 34 sources twenty microamps. The amount of current sourced by current source 34 determines the amount of current which is sourced in combination by current source transistors 58 and 60.

For purposes of illustration, assume that the output quiescent current conducted by transistors 80 and 82 without a load being connected to output terminal 81 exceeds the predetermined amount of one hundred microamps. The current conducted by transistor 50 then exceeds ten microamps but transistor 54 continues to only sink ten microamps. Therefore, the voltage potential of the gate of transistor 32 increases. Similarly, the current conducted by transistor 44 then exceeds ten microamps but transistor 40 continues to source only ten microamps. Therefore, the voltage potential of the gate of transistor 31 decreases. Transistor 32 is made to conduct less current and transistor 31 conducts a proportionate amount more. Transistor 38 conducts less and the current in transistor 38 is mirrored to transistors 56 and 58 which also conduct less. Transistor 36 conducts more and the current in transistor 36 is mirrored to transistors 60 and 62 which also conduct more. Since transistor 62 is more conductive, the gate of transistor 82 has a lower voltage potential which makes transistor 82 conduct less. Since transistors 56 and 58 conduct less, the gate of transistor 80 rises in potential which causes transistor 80 to conduct less until transistors 80 and 82 return to conducting one hundred microamps.

Assume now that the quiescent current conducted by transistors 80 and 82 without a load being connected to output terminal 81 is less than one hundred microamps. Transistor 50 is not able to source ten microamps to current sink transistor 54 which results in the gate of transistor 32 going lower in voltage potential. Transistor 44 also conducts less than ten microamps, so the gate potential of transistor 31 rises. Transistor 32 conducts more and transistor 31 conducts a proportionate amount less. The result is that transistors 56 and 58 conduct more and transistors 60 and 62 conduct less. Therefore, transistor 56 makes the gate of transistor 80 lower in voltage potential thereby making transistor 80 conduct more current until transistor 80 conducts the predetermined amount of one hundred microamps again. Transistor 62 makes the gate of transistor 82 rise by not conducting as strongly. Therefore, transistor 82 again begins to sink one hundred microamps of quiescent current.

If a load impedance is connected to output terminal 81, it should be noted that power amplifier circuit 25 permits the current in either of output transistors 80 or 82 to exceed one hundred microamps in order to drive the load. However, circuit 25 does not allow both of output transistors 80 and 82 to conduct more than the predetermined quiescent current simultaneously. As a result, voltage amplification of the differential input signals occurs substantially independently of quiescent current control.

The voltage gain, Av, of amplifier circuit 25 for the P-channel output portion is:

$$Av = (\tfrac{1}{2})[(gm_{64})(R64)][(gm_{72})(R72)][(gm_{80})(R81)] \quad (1)$$

where
- $gm_{64}$ = transconductance of transistor 64;
- R64 = impedance at the drain of transistor 64;
- $gm_{72}$ = transconductance of transistor 72;
- R72 = impedance at the drain of transistor 72;
- $gm_{80}$ = transcondcutance of transistor 80; and
- R81 = impedance at output terminal 81.

The voltage gain of amplifier circuit 25 for the N-channel output portion is a similar gain expression. Circuits which have three gain stages usually have stability problems, but an examination of equation (1) will show why circuit 25 does not have a stability problem. The impedance at the drain of transistor 64 is dominated by the low impedance $(1/g_m)$ of diode configured transistor 68. By matching the sizes of transistors 68 and 72, the impedance at the drain of transistor 64 equals $(1/g_m 72)$, the reciprocal of the transconductance of transistor 72. Substituting $(1/g_m 72)$ for R64 in equation (1) results in the voltage gain equaling:

$$A_v = (\tfrac{1}{2})[(g_m 64)(R72)][(g_m 80)(R81)]. \quad (2)$$

Therefore, input signal portion 27 and output portion 28 only have two high gain stages, which significantly simplifies the frequency compensation. The approximate dominant pole frequency is represented in equation (3) by the expression:

$$P = (1)/[(C_{86})(g_m 80)(R72)(R81)] \quad (3)$$

where
- $C_{86}$ = capacitance of capacitor 86;
- $g_m 80$ = transconductance of transistor 80;
- R72 = impedance at the drain of transistor 72; and
- R81 = impedance at output terminal 81.

It should be noted that the drain-to-source impedance of input transistors 64 and 66 affects neither the gain nor the dominant pole location of circuit 25. Therefore, the open-loop gain of circuit 25 may be set by adjusting the size of the input transistors 64 and 66 independently of locating the dominant pole frequency. The dominant pole frequency is independently determined by the capacitive value of capacitor 86. Since open-loop gain and dominant pole frequency are independently adjustable, amplifier circuit 25 may be easily stabilized.

By now it should be apparent that a line driver power amplifier has been provided which provides an output voltage which can vary substantially between power supply voltage potentials. The amplifier is stable and maintains a predetermined output quiescent current independent of the power supply voltage in order to minimize power consumption. The present invention is particularly advantageous for a single low voltage power supply such as five volts. However, two power supplies may be used and other voltages may be utilized. The power amplifier is capable of driving low impedance loads while continuing to provide an output voltage range that extends within a fraction of a volt of a small power supply potential such as five volts.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A low voltage line driver circuit having a substantially full range output voltage relative to a power supply voltage range, said output voltage provided by an output stage having a first transistor of a first conductivity type coupled between a power supply voltage terminal and an output terminal and having a second transistor of a second conductivity type coupled between the output terminal and a reference voltage terminal, said line driver circuit maintaining an output quiescent current substantially at a predetermined value, comprising:

input means coupled to the output stage for providing first and second control signals to the first and second transistors, respectively, to provide the output voltage in response to a differential between first and second input voltages; and quiescent current control means coupled to both the input means and the output stage, for receiving first and second mirror currents from the first and second transistors and mirroring first and second compensation currents to the input means to adjust the output quiescent current in response to deviation from the predetermined value.

2. The low voltage line driver of claim 1 wherein the first conductivity type is P-type and the second conductivity type is N-type.

3. The low voltage line driver of claim 1 wherein the input means further comprises:

a first transistor of the second conductivity type having first and second current electrodes and a control electrode for receiving a first input voltage;

a second transistor of the second conductivity type having a first current electrode, a control electrode for receiving a second input voltage, and a second current electrode coupled to the second current electrode of the first transistor;

a third transistor of the second conductivity type having a first current electrode coupled to the second current electrode of the second transistor, a control electrode coupled to the quiescent current control means, and a second current electrode coupled to the reference voltage terminal;

a fourth transistor of the second conductivity type having a first current electrode coupled to the second current electrode of the second transistor, a control electrode coupled to the quiescent current control means, and a second current electrode coupled to the reference voltage terminal;

a fifth transistor of the first conductivity type having a first current electrode coupled to the power supply voltage terminal, and a control electrode coupled to both a second current electrode thereof and the first current electrode of the first transistor;

a sixth transistor of the first conductivity type having a first current electrode coupled to the power supply voltage terminal, and a control electrode coupled to both a second current electrode thereof and a first current electrode of the second transistor;

a seventh transistor of the first conductivity type having a first current electrode coupled to the power supply voltage terminal, a control electrode coupled to the second current electrode of the fifth transistor, and a second current electrode coupled to the quiescent current control means;

an eighth transistor of the second conductivity type having a first current electrode coupled to the second current electrode of the seventh transistor, a second current electrode, and a control electrode coupled to a second reference voltage terminal;

a ninth transistor of the second conductivity type having a first current electrode coupled to the second current electrode of the eighth transistor, a control electrode coupled to the quiescent current control means, and a second current electrode coupled to the first reference voltage terminal;

a tenth transistor of a first conductivity having a first current electrode coupled to the power supply voltage terminal, a control electrode coupled to the control electrode of the seventh transistor, and a second current electrode;

an eleventh transistor of a first conductivity type having a first current electrode coupled to the second current electrode of the tenth transistor, a control electrode coupled to the second reference voltage terminal, and a second current electrode; and a twelfth transistor of a second conductivity type having a first current electrode coupled to the second current electrode of the eleventh transistor, a control electrode coupled to the quiescent current control means, and a second current electrode coupled to the first reference voltage terminal.

4. The low voltage line driver of claim 3 further comprising:

a first frequency compensation capacitor having a first electrode coupled to the second current electrode of the eighth transistor, and a second electrode coupled to the output terminal;

a second frequency compensation capacitor having a first electrode coupled to the second current electrode of the tenth transistor, and a second electrode coupled to the output terminal.

5. The low voltage line driver of claim 1 wherein the quiescent current control means comprise:

a first transistor of the first conductivity type having first and second current electrodes, and a control electrode;

a second transistor of the first conductivity type having first and second current electrodes, and a control electrode;

a third transistor of the first conductivity type having a first current electrode coupled to the power supply voltage terminal, a control electrode coupled to a bias voltage terminal, and a second current electrode coupled to the first current electrodes of the first and second transistors;

a fourth transistor of the second conductivity type having a first current electrode connected to a control electrode thereof and coupled to both the second current electrode of the first transistor and the input means;

a fifth transistor of the second conductivity type having a first current electrode connected to a control electrode thereof and coupled to both the second current electrode of the second transistor and the input means;

a sixth transistor of the first conductivity type having a first current electrode coupled to the power supply voltage terminal, a control electrode coupled to both the input means and a control electrode of the first transistor of the output stage, and a second current electrode;

a seventh transistor of the first conductivity type having a first current electrode coupled to the second current electrode of the sixth transistor, and a control electrode connected to a second current electrode thereof and coupled to a control electrode of the second transistor;

an eighth transistor of the second conductivity type having a first current electrode coupled to the second current electrode of the seventh transistor, a control electrode, and a second current electrode coupled to the reference voltage terminal;

a ninth transistor of the first conductivity type having a first current electrode coupled to the power supply voltage terminal, a control electrode coupled to the bias voltage terminal, and a second current electrode;

a tenth transistor of the first conductivity type having a first current electrode coupled to the second current electrode of the ninth transistor, a control electrode connected to a second current electrode thereof and coupled to the control electrode of the first transistor;

an eleventh transistor of the second conductivity type having a first current electrode coupled to the second current electrode of the tenth transistor, a control electrode coupled to both the input means and the second transistor of the output stage, and a second current electrode coupled to the reference voltage terminal;

a twelfth transistor of the first conductivity type having a first current electrode coupled to the power supply voltage terminal, a control electrode coupled to the bias voltage terminal, and a second current electrode; and a thirteenth transistor of the second conductivity type having a first current electrode coupled to both the second current electrode of the twelfth transistor and the control electrode of the eighth transistor, the first current electrode also being connected to a control electrode thereof, and having a second current electrode coupled to the reference voltage terminal.

6. An amplifier circuit having a wide output voltage range in relation to a power supply voltage range for both low and high power supply voltage potentials, comprising:

an input stage having a first differential input pair of transistors, a load coupled to the first pair of transistors, and a current source coupled to the first pair of transistors for providing a source current to the first pair of transistors;

first and second intermediate stages coupled in parallel to the input stage for providing first and second control signals, respectively;

an output stage having two transistors of opposite conductivity type coupled in series for providing an output signal in response to the first and second control signals, the two output stage transistors conducting an output quiescent current having a substantially constant predetermined value when no output load is coupled to the output stage; and output quiescent control means coupled to the input stage, the first and second intermediate stages and the output stage, said control means biasing a second differential input pair of transistors by mirroring the output quiescent current in each of the two transistors of the output stage to the control means, said control means mirroring first and second compensation currents to the first and second intermediate stages to adjust the output quiescent current in response to deviation from the predetermined value.

7. The amplifier circuit of claim 6 wherein the output stage further comprises:
a P-channel transistor having a source coupled to a positive first power supply voltage, a gate coupled to the first control signal, and a drain coupled to an output terminal for providing the output signal; and
an N-channel transistor having a drain coupled to the drain of the P-channel transistor, a gate coupled to the second control signal, and a source coupled to a first reference voltage less positive than the first power supply voltage.

8. The amplifier circuit of claim 6 further comprising:
a first frequency stabilizing capacitor having a first electrode coupled to the first intermediate stage, and a second electrode coupled to the output stage at an output terminal formed between the two transistors of opposite conductivity; and
a second frequency stabilizing capacitor having a first electrode coupled to the second intermediate stage, and a second electrode coupled to the output terminal.

9. A method of providing an amplifier having a wide output voltage range in relation to a power supply voltage range for both low and high power supply voltage potentials, comprising the steps of:
providing an input stage with a first differential input pair of transistors, a load coupled to the first pair of transistors, and a current source coupled to the first pair of transistors for providing a first predetermined current to the first pair of transistors;
coupling first and second intermediate stages in parallel to the input stage for providing first and second control signals, respectively;
coupling two transistors of opposite conductivity in series between terminals for receiving the high and low power supply voltage potentials, said two transistors receiving the first and second control signals, respectively, and providing an output signal in response thereto, and conducting a substantially constant output quiescent current of predetermined value when no output load is coupled to the two transistors;
coupling control means to the input stage, the first and second intermediate stages and the two transistors of opposite conductivity for biasing a second differential input pair of transistors by mirroring the predetermined output quiescent current in each of the two transistors of opposite conductivity to the control means; and
mirroring first and second compensation currents to the first and second intermediate stages to adjust variations of the output quiescent current in response to deviation from the predetermined value.

* * * * *